US007884751B2

(12) United States Patent
Shimizu et al.

(10) Patent No.: US 7,884,751 B2
(45) Date of Patent: Feb. 8, 2011

(54) TIME-TO-DIGITAL CONVERTER

(75) Inventors: Kazuya Shimizu, Kiryu (JP); Masato Kaneta, Takasaki (JP); Haruo Kobayashi, Kiryu (JP); Tatsuji Matsuura, Tokyo (JP); Katsuyoshi Yagi, Sagamihara (JP); Akira Abe, Sapporo (JP); Koichiro Mashiko, Takarazuka (JP)

(73) Assignee: Semiconductor Technology Academic Research Center, Yokohama (JP)

( * ) Notice: Subject to any disclaimer, the term of this patent is extended or adjusted under 35 U.S.C. 154(b) by 111 days.

(21) Appl. No.: 12/382,056

(22) Filed: Mar. 6, 2009

(65) Prior Publication Data

US 2009/0225631 A1 Sep. 10, 2009

(30) Foreign Application Priority Data

Mar. 7, 2008 (JP) ............................ 2008-058450

(51) Int. Cl.
*H03M 1/50* (2006.01)

(52) U.S. Cl. ...................................... 341/166; 327/269

(58) Field of Classification Search ......... 341/111-166; 327/256, 158, 160, 269, 271, 284, 241; 368/113
See application file for complete search history.

(56) References Cited

U.S. PATENT DOCUMENTS

| | | | | |
|---|---|---|---|---|
| 5,836,004 | A * | 11/1998 | Jiang et al. | 341/166 |
| 6,729,916 | B2 * | 5/2004 | Pan | 439/885 |
| 7,427,940 | B2 * | 9/2008 | Staszewski et al. | 341/155 |
| 7,475,049 | B2 * | 1/2009 | Su et al. | 706/45 |
| 7,501,973 | B2 * | 3/2009 | Choi et al. | 341/166 |
| 7,570,182 | B2 * | 8/2009 | Sheba et al. | 341/118 |
| 7,629,915 | B2 * | 12/2009 | Lin | 341/166 |
| 7,667,633 | B2 * | 2/2010 | Choi et al. | 341/166 |

FOREIGN PATENT DOCUMENTS

| | | |
|---|---|---|
| JP | 9-64197 | 3/1997 |

OTHER PUBLICATIONS

J. Jansson, et., "A CMOS Time-to-Digital Converter With Better Than 10 ps Single-Shot Precision", JSSC, vol. 41, No. 6, Jun. 2006.

(Continued)

*Primary Examiner*—Lam T Mai

(57) ABSTRACT

A TDC circuit having a small scale circuit and high resolution is disclosed, which is a time-to-digital converter that detects a phase with respect to a reference clock of a signal to be measured, comprising a first delay line in which a plurality of first delay elements with a first delay amount is connected in series, a second delay line group that is connected to a plurality of connection nodes of the first delay line or an input node in the first stage and in which at least one or more second delay elements with a second delay amount different from the first delay amount are connected in series, a plurality of judgment circuits that judge whether the changing edge of the signal to be measured is advanced or delayed with respect to the changing edges of a delayed clock output from the first delay element and the second delay element, and an operation circuit that calculates a phase with respect to the reference clock of the changing edge of the signal to be measured from the judgment results, wherein a difference between the first delay amount and the second delay amount is smaller than the first delay amount and the second delay amount.

4 Claims, 7 Drawing Sheets

OTHER PUBLICATIONS

R. B. Staszewski, et., "All-Digital TX Frequency Synthesizer and Discrete-Time Receiver for Bluetooth Radio in 130-nm CMOS", IEEE Journal of Solid-State Circuits, vol. 39, No. 12, Dec. 2004.

K. Nose, M. Kajita, M. Mizuno, "A 1-ps Resolution Jitter-Measurement Macro Using Interpolated Jitter Oversampling", IEEE JSSC, vol. 41, No. 12, pp. 2911-2920 (Dec. 2006).

J. Rivoir, "Fully-Digital Time-To-Digital Converter for ATE with Autonomous Calibration", IEEE International Test Conference, Santa Clara, (Oct. 2006).

J. Rivoir, "Statistical Linearity Calibration of Time-To-Digital Converters Using a Free-Running Ring Oscillator", 15th Asian Test Symposium (2006).

* cited by examiner

TIME-TO-DIGITAL CONVERTER

BACKGROUND OF THE INVENTION

1. Field of the Invention

The present invention relates to a time-to-digital converter (TDC), and more specifically, to a TDC having a small circuit scale and high resolution.

2. Related Art

Recently, the performance of AD converters has improved remarkably and there is a demand for the detection of the accuracy of control signals that serve as a reference for operation, for example, the detection of jitters and periodic errors, with high precision. As a circuit to detect phase (jitter) with respect to the reference clock of a signal to be measured, which is a control signal, a TDC is widely known.

FIG. 1A is a diagram showing a basic circuit configuration of a conventional TDC and FIG. 1B is a time chart showing the circuit operation of the conventional TDC in FIG. 1A.

As shown in FIG. 1A, the TDC has a delay circuit line (delay line), in which a plurality of delay elements (non-inverter buffers) 11 that sequentially delay an original clock CK by a predetermined delay amount $\tau 1$ are connected in series, a plurality of flip-flops 12 that receive each of delayed clocks CK1, CK2, CK3, . . . , sequentially delayed by the delay line as a data input and a signal SC to be measured as a clock input, and an encoder circuit 13 that calculates a jitter of the signal SC to be measured with respect to the original clock CK 35 from outputs Q1, Q2, Q3, . . . , of the plurality of flip-flops 12.

Non-inverter buffer 11 is realized by, for example, connecting inverters in two stages, or using a circuit described in Japanese Unexamined Patent Publication (Kokai) No. H9-64197. The number of connected non-inverters 11 needs to be greater than or equal to a number calculated by dividing the expected magnitude of the jitter of signal SC to be measured by the delay amount of non-inverter buffer 11 plus a predetermined margin.

As shown in FIG. 1B, delayed clocks CK1, CK2, CK3, . . . , output from each of non-inverter buffers 11 are delayed from one another by a predetermined delay amount. When signal SC to be measured rises, delayed clocks CK1, CK2 before a certain delayed clock are in the "high (H)" state and outputs Q1, Q2 of flip-flop 12 are "H", however, delayed clocks CK3, . . . , after that are in the "low (L)" state and outputs Q3, . . . , of flip-flop 12 are "L", and therefore, it is possible to detect the timing at which signal SC to be measured with respect to original clock CK rises by detecting the position at which the output of flip-flop 12 changes using encoder circuit 13. If there is a jitter in the rise of signal SC to be measured, the position at which the output of flip-flop 12 changes is different, and the output of encoder circuit 13 changes as a result.

Documents: J. Jansson, et., "A CMOS Time-to-Digital Converter With Better Than 10 ps Single-shot Precision", JSSC, Vol. 41, NO. 6, JUNE 2006, and R. Staszewski, et., Digital RF Processor DRP™ for Cellular Phones", ISSCC, 200 describe the TDC shown in FIG. 1A. The document of R. Staszewski cannot be easily obtained. The contents of this documents are included in R. B. Staszewski, et., "All-Digital Tx Frequency Synthesizer and Discrete-Time Receiver for Bluetooth Radio in 130-nm CMOS", IEEE JOURNAL OF SOLID-STATE CIRCUITS, VOL. 39, NO. 12, DECEMBER 2004.

Document: K. Nose, M, Kajita, M. Mizuno, "A 1 ps-Resolution Jitter-Measurement Macro Using Interpolated Jitter Oversampling", IEEE JSSC, vol. 41, no. 12, pp. 2911-2920 (December 2006) describes a TDC in which delay units with the delay amount $n\tau 1$ (n is an integer) including a plurality of non-inverter buffers are connected in series, and groups, each of which includes n−1 non-inverter buffers with delay amount $\tau 1$ connected in series, are respectively connected at each connection node of the delay units. A circuit of the TDC is formed in a small range.

In the TDC shown in FIG. 1A and the TDC described in document: K. Nose, M, Kajita, M. Mizuno, "A 1 ps-Resolution Jitter-Measurement Macro Using Interpolated Jitter Oversampling", IEEE JSSC, vol. 41, no. 12, pp. 2911-2920 (December 2006), the time resolution of the jitter of the measured signal is the delay amount of the non-inverter buffer. As described above, the delay amount of the non-inverter buffer has a limit because it is regulated by a process etc. On the other hand, it is possible to manufacture two kinds of non-inverter buffer with a small difference between delay amounts. For example, although it is difficult to stably manufacture a non-inverter buffer with a delay amount of 2 ps, it is possible to stably manufacture non-inverter buffers with delay amounts of 10 ps and 8 ps (of course variations involved).

Documents: J. Rivoir, "Fully-Digital Time-to-Digital Converter for ATE with Autonomous Calibration", IEEE International Test Conference, Santa Clara, (October 2006), and J. Rivoir, "Statistical Linearity Calibration of Time-to-Digital Converters Using a Free-Running Ring Oscillator", 15th Asian Test Symposium (2006) describe the vernier delay line TDC that has improved the time resolution by providing two kinds of delay line in which two kinds of non-inverter buffer with delay amounts slightly different from each other are connected in series, respectively, and by inputting a reference clock to one of them and a signal to be measured to the other and comparing the outputs in the corresponding stages.

FIG. 2 is a diagram showing the configuration and operation of the TDC that has increased the time resolution described in documents: J. Rivoir, "Fully-Digital Time-to-Digital Converter for ATE with Autonomous Calibration", IEEE International Test Conference, Santa Clara, (October 2006), and J. Rivoir, "Statistical Linearity Calibration of Time-to-Digital Converters Using a Free-Running Ring Oscillator", 15th Asian Test Symposium (2006), wherein FIG. 2A shows the circuit configuration and FIG. 2B shows the time chart of the circuit operation.

As shown in FIG. 2A, the TDC has a first delay line in which a plurality of non-inverter buffers 14 that sequentially delay original clock CK by first predetermined delay amount $\tau 1$ is connected in series, a second delay line in which a plurality of non-inverter buffers 15 that sequentially delay signal to be measured SC by a second predetermined delay amount $\tau 2$ is connected in series, a plurality of flip-flops 16 that receive each of delayed clocks CK1, CK2, CK3, . . . , sequentially delayed in the first delay line as a data input and each of delayed signals SC1, SC2, SC3, . . . , sequentially delayed in the second delay line as a clock input, and an encoder circuit 17 that calculates the jitter of a signal to be measured with respect to clock CK from outputs Q1, Q2, Q3, . . . , of the plurality of flip-flops 16. First predetermined delay amount $\tau 1$ is greater than second predetermined delay amount $\tau 2$ ($\tau 1 > \tau 2$). The number of connected non-inverter buffers 14 and 15 needs to be greater than or equal to a number calculated by dividing the expected magnitude of the jitter of signal SC to be measured by the difference between the delay amounts of non-inverter buffers 14 and 15 plus a predetermined margin.

As shown in FIG. 2B, delayed clocks CK1, CK2, CK3, . . . , output from each of non-inverter buffers 14 are delayed by $\tau 1$ from one another and delayed signals SC1, SC2, SK3, . . . to be measured, output from each of non-inverter buffers 15 are delayed by $\tau 2$ from one another. As described above, $\tau 1 > \tau 2$, and therefore, even if CK1 rises prior to SC1, the difference between the timing of the CK rise and the timing of the SC rise becomes gradually smaller, and will change so that SC3 rises prior to CK3 in due course. In response to this, outputs Q1, Q2 of flip-flops 16 become "H"; however, outputs Q3, of flip-flops 16 after that become "L". It is possible to detect the timing at which delayed signal SC to be measured rises prior to delayed clock CK by detecting the position at which the outputs of flip-flops 12 change using encoder circuit 17. In the configuration of the TDC in FIG. 2A, the time resolution in detection of jitter of signal SC to be measured is the difference between the delay amounts of non-inverter buffer 14 and non-inverter buffer 15. As a result, it is possible to measure jitter with a high resolution by appropriately selecting the delay amounts of non-inverter buffer 14 and non-inverter buffer 15.

SUMMARY OF THE INVENTION

With the vernier delay line TDC in FIG. 2A, resolution can be improved; however, there is a problem that the circuit scale is increased because the number of non-inverter buffers needs to be twice that of stages.

Further, with the vernier delay line TDC in FIG. 2A, the signal to be measured passes through the second delay line. Because of this, there is a problem that jitter readily occurs in the path of the signal to be measured.

An object of the present invention is to solve the above-described problems and reduce the circuit scale of a TDC circuit with a high resolution.

In order to realize the above-mentioned object, in the time-to-digital converter (TDC) of the present invention, to the connection node or the input in the first stage of the first delay line in which first delay elements with a first delay amount are connected in series, one or more second delay elements with a second delay amount different from the first delay amount are connected in series, and a plurality of delayed clocks with a delay amount, which is an integer multiple of a unit delay amount, the unit delay amount being a difference between the first delay amount and the second delay amount, is generated successively, and as in the configuration in FIG. 1A, the relationship between the changing edges of the plurality of delayed clocks and a signal to be measured is detected with a plurality of judgment circuits (flip-flops) and an operation circuit (encoder circuit). If the first delay amount and the second delay amount are set so that the unit delay amount is small, the time resolution can be increased.

In other words, the time-to-digital converter (TDC) of the present invention is a time-to-digital converter that detects a phase with respect to a reference clock of a signal to be measured, characterized by comprising: the first delay line, in which the plurality of the first delay elements that delay an input signal by the first delay amount is connected in series, and to the first delay element in the first stage of which, the reference clock is input; the second delay line group connected to the connection node of the plurality of the first delay elements of the first delay line or the input node of the first delay element in the first stage, and in which at least one or more of the second delay elements that delay the input signal by the second delay amount different from the first delay amount are connected in series; the plurality of the judgment circuits that judge whether the changing edge of the signal to be measured is advanced or delayed with respect to the changing edge of the signal, which is the delayed reference clock output from the plurality of the first delay elements of the first delay line and the plurality of the second delay elements of the second delay line group; and the operation circuit that calculates the phase with respect to the reference clock of the changing edge of the signal to be measured from the judgment result of the plurality of the judgment circuits, wherein the difference between the first delay amount and the second delay amount is smaller than the first delay amount and the second delay amount.

The conventional TDC shown in FIG. 2A requires two delay elements in order to generate a difference between the first delay amount and the second delay amount (unit delay amount). In contrast to this, according to the present invention, one delay element generates a unit delay amount, and therefore the number of delay elements can be halved and the circuit scale can be reduced.

In addition, because the signal to be measured does not pass through the delay line, it is unlikely that a jitter occurs in the path of the signal to be measured.

As described above, it is desirable that the difference between the first delay amount and the second delay amount (unit delay amount) that is smaller than the first delay amount and the second delay amount be 1/n of the first delay amount where n is an integer.

In the second delay line group, there is the possibility that a delayed clock with the same delay amount as that of the other second delay line occurs in the second delay line in which the plurality of the second delay elements is connected. In such a case, it is desirable that the portion at which the delayed clock with the same delay amount occurs in a duplicated manner be removed.

Further, it is also possible to generate more kinds of delayed clock by connecting a third delay element that delays by a third delay amount different from the first delay amount and the second delay amount to the connection node of the first delay line and the second delay line group etc. In such a case, it is necessary to provide a judgment circuit (flip-flop) at the output portion of the third delay element. Although the number of inputs to the operation circuit (encoder circuit) increases, the function remains the same.

According to the present invention, it is possible to realize a TDC circuit with a high resolution on a small circuit scale.

BRIEF DESCRIPTION OF THE DRAWINGS

The features and advantages of the invention will be more clearly understood from the following description taken in conjunction with the accompanying drawings, in which.

DESCRIPTION OF THE PREFERRED EMBODIMENTS

Figure 3:
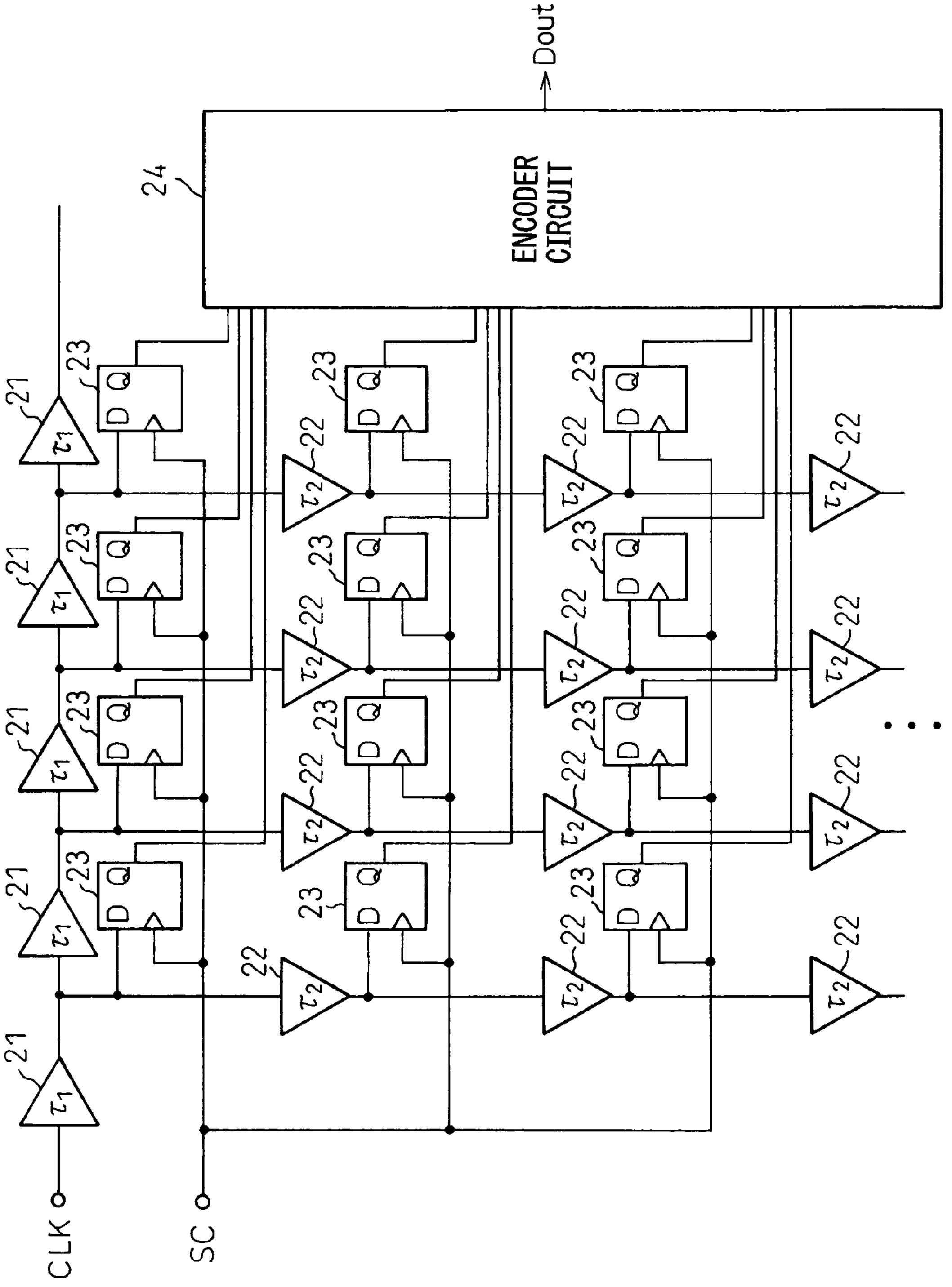
FIG. 3 is a diagram showing a basic configuration of a TDC in an embodiment of the present invention.

FIG. 3 is a diagram showing a basic configuration of a time-to-digital converter (TDC) of the present invention.

As shown in FIG. 3, a first delay line is provided, in which a plurality (five in the figure) of first delay elements (non-inverter buffers) 21 with delay amount $\tau 1$ is connected in series, and a reference clock CLK is input to the first stage. A second delay line, in which a plurality (three in the figure) of second delay elements (non-inverter buffers) 22 with a second delay amount $\tau 2$ is connected in series, is connected to each of the connection nodes (four in the figure) of first delay elements 21. The plurality (four in the figure) of the second delay lines is referred to as a second delay line group. In FIG. 3, the second delay line is not connected to the input node of the first delay element in the first stage of the first delay line; however, it is also possible to provide such a second delay line, as will be described later.

First delay element 21 and second delay element 22 output a delayed clock, which is a reference clock delayed by a total amount of delays in the respective paths from first delay element 21 in the respective first stages. Consequently, delayed clocks with a delay amount, which is one of various combinations of first delay amount $\tau 1$ and second delay amount $\tau 2$, such as, for example, $2\tau 1$, $\tau 1+\tau 2$, $2\tau 1+\tau 2$, $2\tau 1+2\tau 2$, . . . are output. For example, in the case of $2\tau 1$ and $\tau 1+\tau 2$, the delayed clock is one with a difference of $\tau 1-\tau 2$. It is possible for first delay element 21 and second delay element 22 to output delayed clocks the delay amount of which is different from one another by $\tau 1-\tau 2$.

Figure 1A:
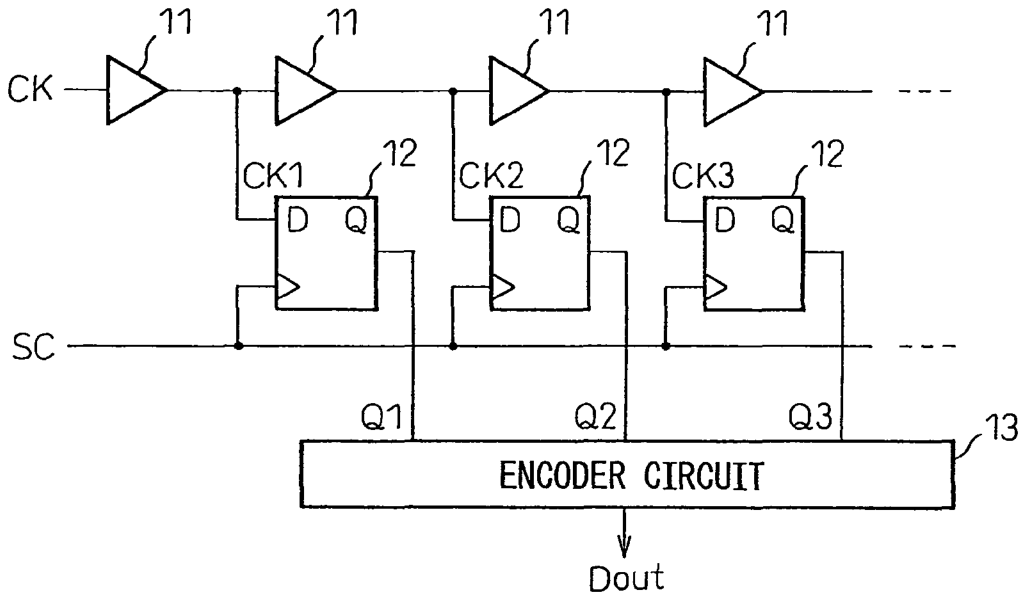
FIG.1A PRIOR ART
FIG. 1A is a diagram showing a circuit configuration of a conventional TDC.
Figure 1B:
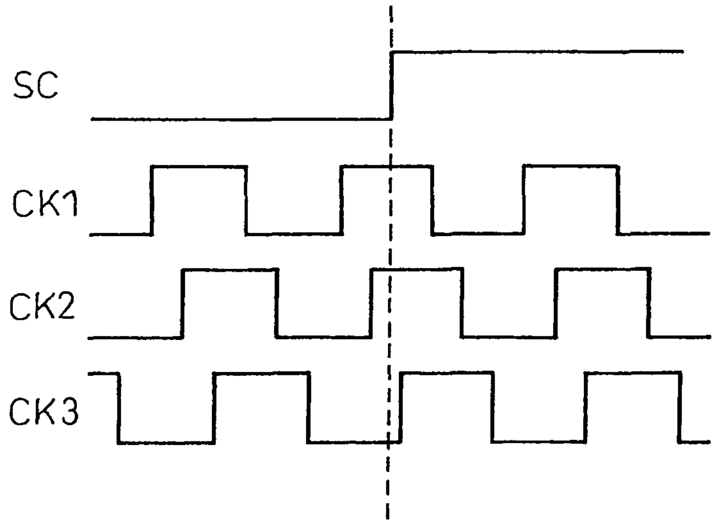
FIG.1B PRIOR ART
FIG. 1B is a time chart showing the operation of a conventional TDC circuit.

A plurality of judgment circuits (flip-flops) 23 is provided, which receives the delayed clocks output from the plurality of the first delay elements and the plurality of the second delay elements, respectively, as a data input and receives signal SC to be measured as a clock input. An operation circuit (encoder circuit) 24 detects the position of the flip-flop 23 at which the detection result changes and detects a phase with respect to reference clock CLK of signal SC to be measured in a manner similar to that explained in FIG. 1B.

Next, an embodiment in which first delay amount $\tau 1$ and second delay amount $\tau 2$ are set specifically in the basic configuration in FIG. 3 is explained.

Figure 4:
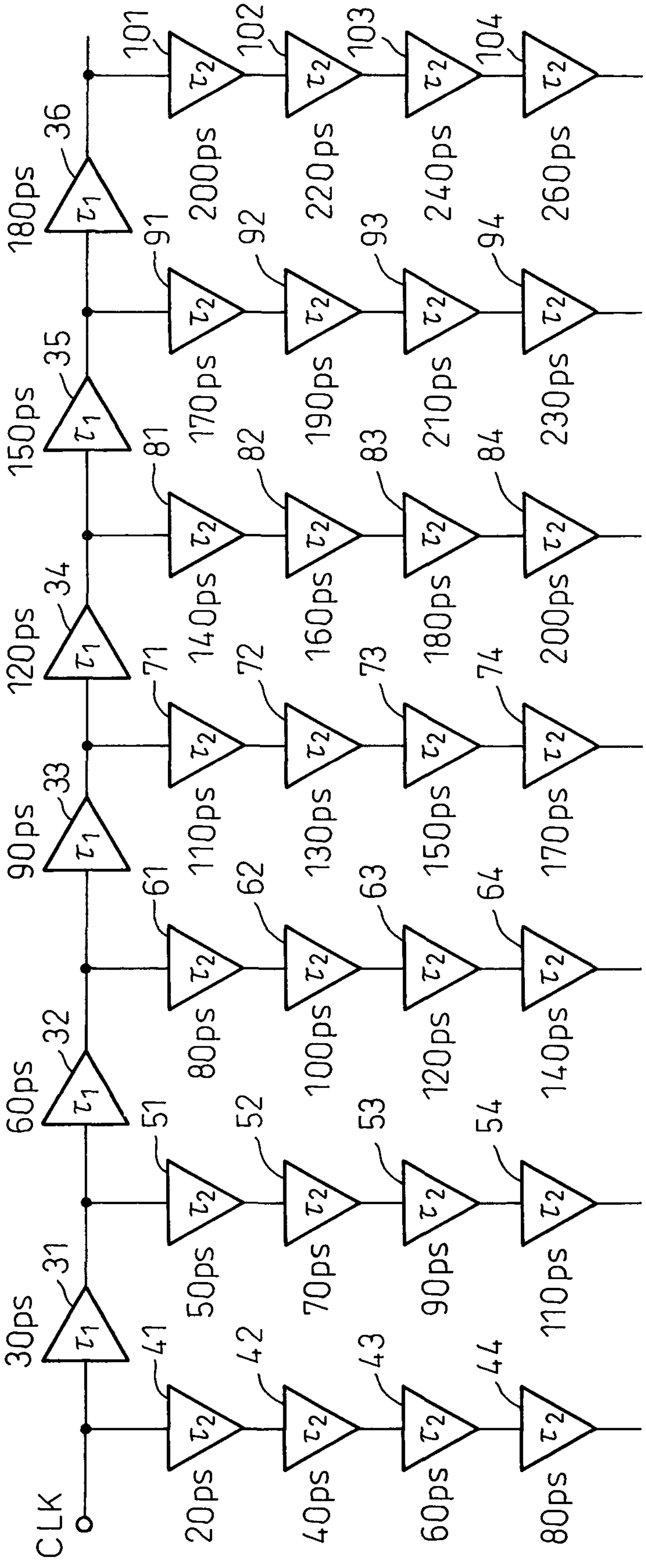
FIG. 4 is a diagram showing a configuration of a first delay line and a second delay line group of a TDC in a first embodiment.

FIG. 4 is a diagram showing the configuration of the first delay line and the second delay line group in the TDC in the first embodiment of the present invention. The TDC in the first embodiment has the basic configuration shown in FIG. 3; however, the schematic representation of the flip-flop and the encoder circuit is omitted here. The TDC in the first embodiment is a TDC that has a time resolution of 10 ps and detects a phase difference up to 200 ps.

As shown in FIG. 4, a first delay line in which six first delay elements (non-inverter buffers) 31-36 delay amount $\tau 1$ of which is 30 ps are connected in series is provided, and reference clock CLK is input to the first stage. To the input node of the first delay element in the first stage, a second delay line in the first place in which four second delay elements (non-inverter buffers) 41-44 delay amount $\tau 2$ of which is 20 ps are connected in series is connected. Similarly, to the connection node of the output node of the first delay element in the first stage and the input node of the first delay element in the second stage, the second delay line in the second place in which four second delay elements (non-inverter buffers) 51-54 with a delay amount of 20 ps are connected in series is connected. This also applies to the following cases similarly such that the third second delay line (i.e., the second delay line in the third place) of second delay elements 61-64 is connected to the connection node of the second stage and the third stage, the fourth second delay line of second delay elements 71-74 to the connection node of the third stage and the fourth stage, the fifth second delay line of second delay elements 81-84 to the connection node of the fourth stage and the fifth stage, the sixth second delay line of second delay elements 91-94 to the connection node of the fifth stage and the sixth stage, and the seventh second delay line of second delay elements 101-104 to the output node in the sixth stage. The plurality of first delay elements 31-36 and the plurality of second delay elements 41-44, 51-54, 61-64, 71-74, 81-84, 91-94, 101-104 each output a delayed clock that is reference clock CLK delayed by a delay amount described near each delay element.

As obvious from FIG. 4, first delay element 32 outputs a delayed clock with a delay amount of 60 ps and second delay element 43 also outputs a delayed clock with a delay amount of 60 ps. As described above, the delayed clock with a delay amount of 60 ps is generated in a duplicated manner, however, only one is enough to detect a phase, and therefore only one is left and the other can be deleted. The output of first delay element 32 is necessary to generate subsequent delayed clocks and cannot be deleted. The output of second delay element 43 is also used as an input to second delay element 44 in the next stage; however, the delayed clock output from second delay element 44 is equal in the delay amount to the delayed clock output from second delay element 61, and therefore, can be deleted.

Figure 5:
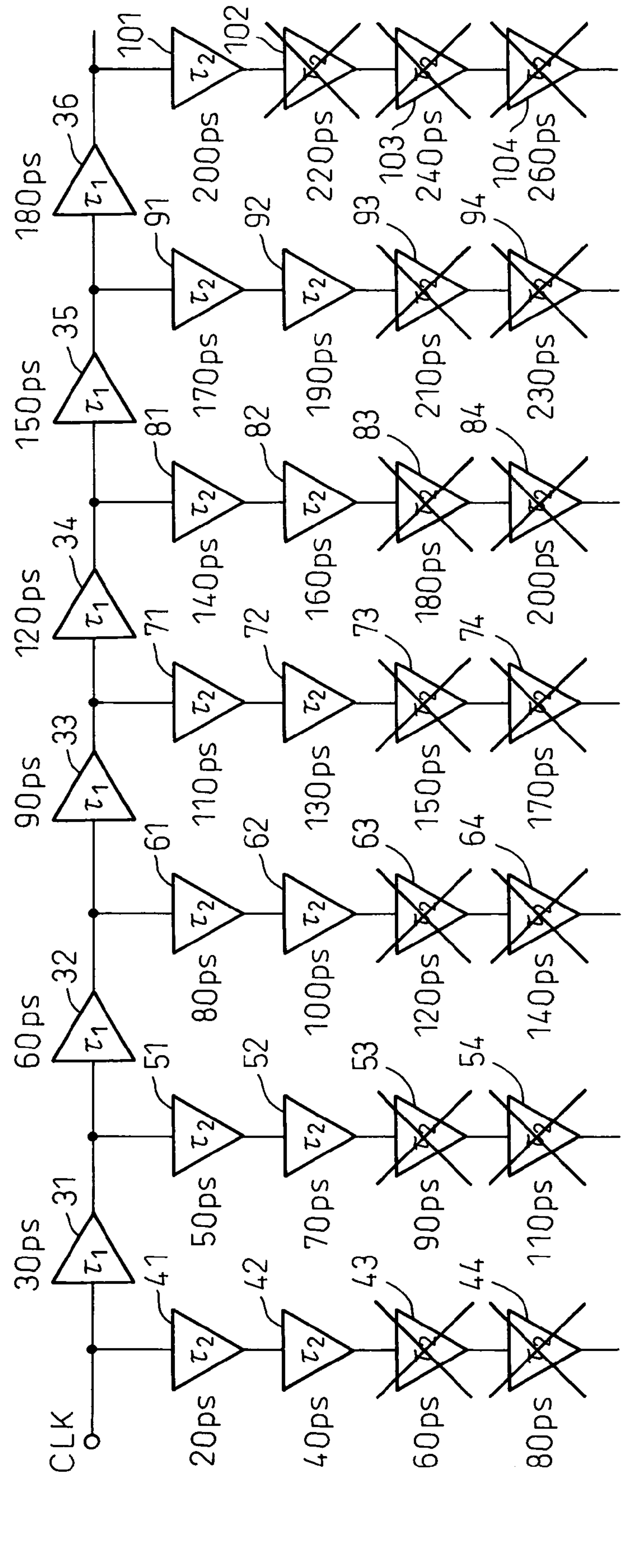
FIG. 5 is a diagram showing delay elements that can be deleted in the first delay line and the second delay line group of the TDC in the first embodiment.

FIG. 5 is a diagram showing the second delay elements that can be deleted, the above being taken into account. In FIG. 5, the second delay elements that can be deleted are shown with × marks attached.

Figure 6:
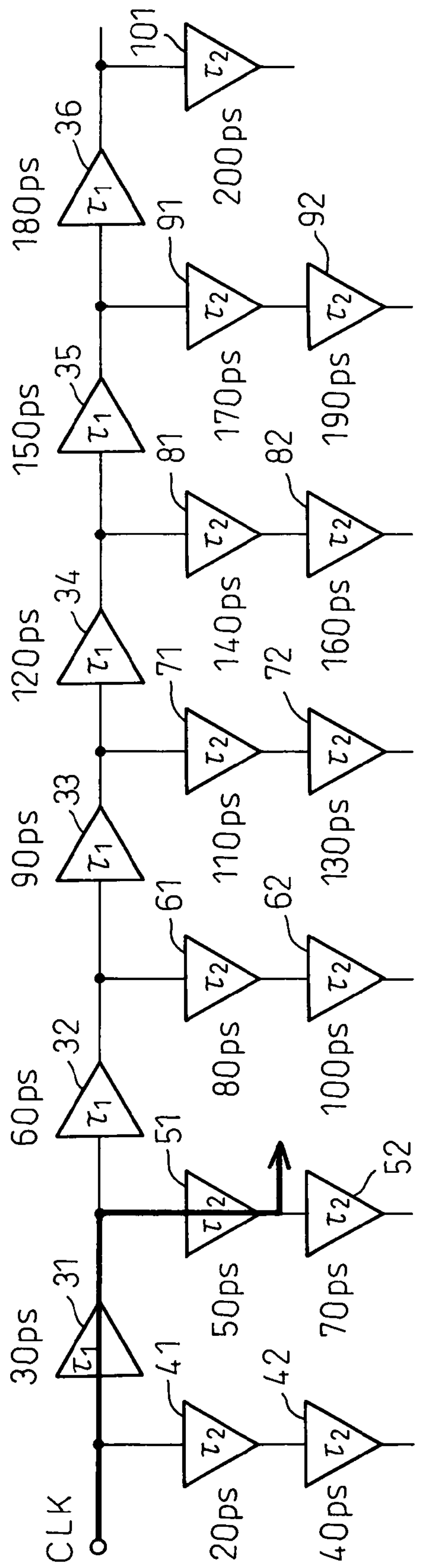
FIG. 6 is a diagram showing a configuration of the first delay line and the second delay line group of the TDC in the first embodiment, from which the delay elements that can be deleted have been actually deleted.

FIG. 6 is a diagram showing the configuration of the first delay line and the second delay line group in the actual TDC in the first embodiment, from which the second delay elements to which x marks are attached have been removed. In this TDC, with the difference $\tau 1-\tau 2$ (10 ps) between first delay amount $\tau 1$ (30 ps) and second delay amount $\tau 2$ (20 ps) as the unit delay amount, delayed clocks with a delay amount up to 200 ps are generated, each delay amount being an integer multiple of the unit delay amount (10 ps). However, it is not possible to generate a delayed clock with a delay amount of 10 ps. In other words, delayed clocks with a delay amount of 20 ps to 200 ps at intervals of 10 ps are generated. In the figure, the arrow shown by a bold line indicates the signal path when a delayed clock with a delay amount of 50 ps is output.

Consequently, as shown in FIG. 3, it is possible to detect the phase with respect to reference clock CLK of signal to be measured SC with a resolution from 20 ps to 200 ps at intervals of 10 ps by detecting the position of the changing edge of the signal to be measured with respect to the delayed clock generated in FIG. 6 using the plurality of judgment circuits (flip-flops) 23 and operation circuit (encoder circuit) 24.

Figure 2A:
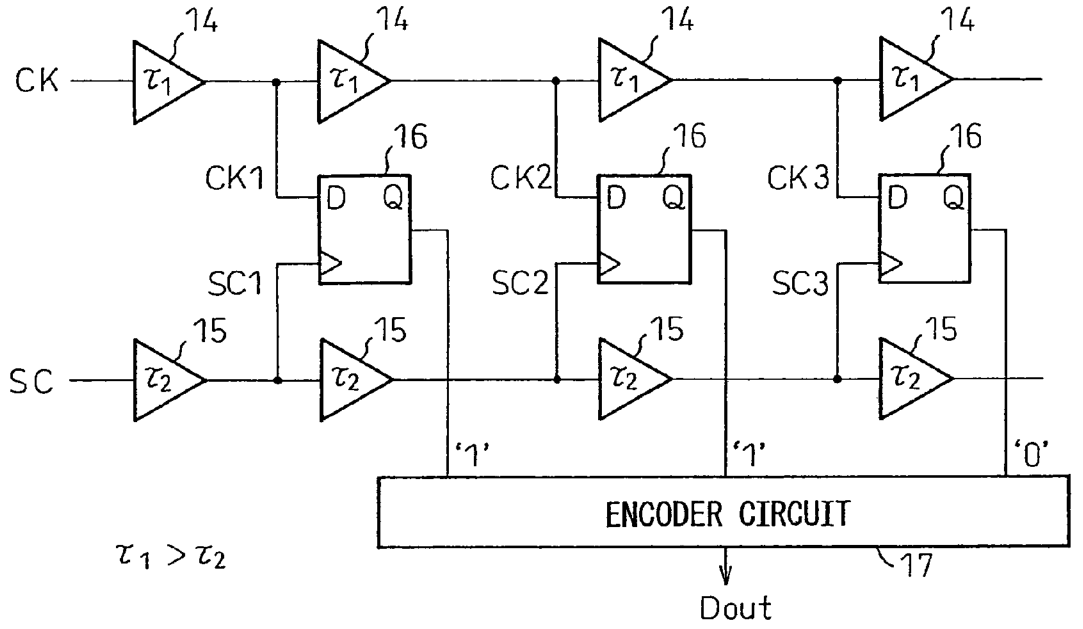
FIG. 2A PRIOR ART
FIG. 2A is a diagram showing a circuit configuration of a conventional vernier delay line TDC.
Figure 2B:
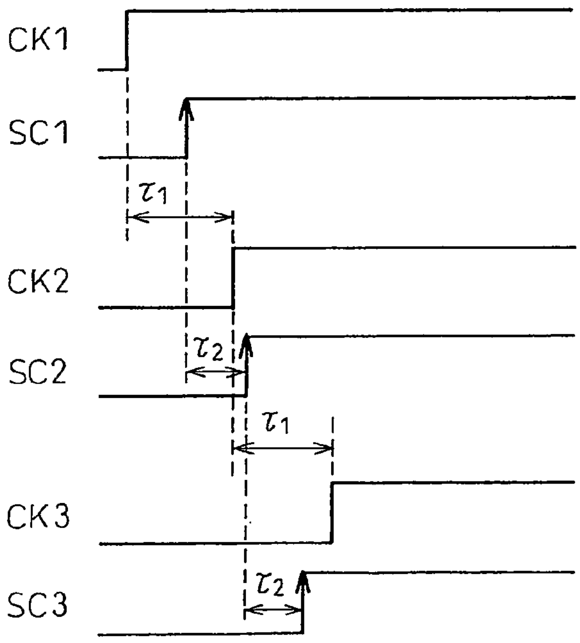
FIG. 2B PRIOR ART
FIG. 2B is a time chart showing the operation of a conventional vernier delay line TDC circuit.

As shown in FIG. 6, the number of delay elements constituting the first delay line and the second delay line group in the TDC in the first embodiment is 19 and the number of flip-flops 23 is also 19. In contrast to this, when the phase with respect to reference clock CLK of signal to be measured SC is detected with a resolution up to 200 ps at intervals of 10 ps in the vernier delay line TDC shown in FIG. 2A, it is necessary to provide 40 delay elements and 20 flip-flops 23. As described above, according to the present invention, the number of delay elements can be halved.

Figure 7:
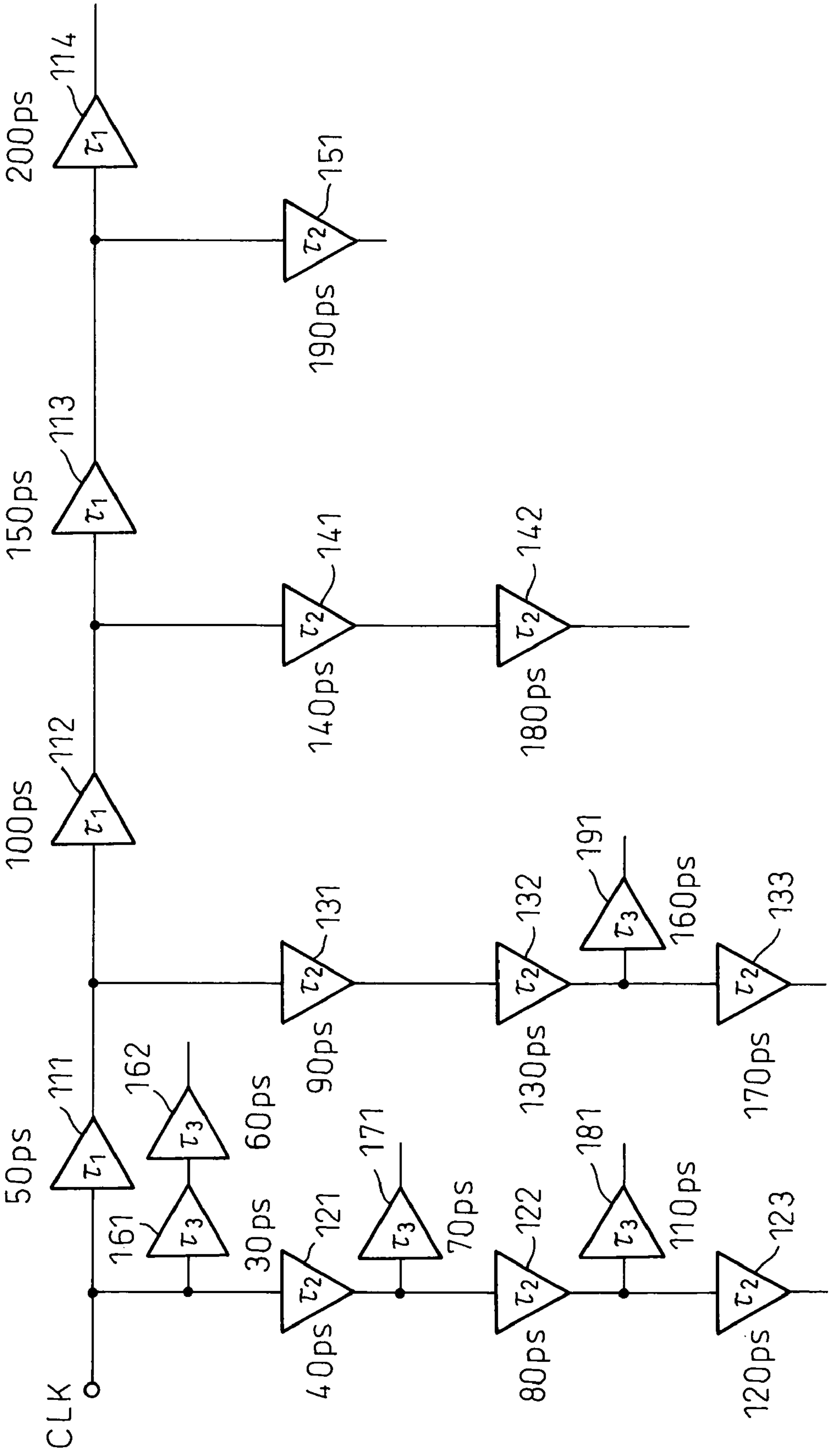
FIG. 7 is a diagram showing a configuration of a first delay line and a second delay line of a TDC in a second embodiment.

FIG. 7 is a diagram showing a configuration of a portion composed of a first delay line, a second delay line group, and third delay elements in a TDC in a second embodiment of the present invention. The TDC in the second embodiment also has the basic configuration shown in FIG. 3; however, the flip-flop and the encoder circuit are not shown schematically here. The TDC in the first embodiment is a TDC that has a time resolution of 10 ps and detects a phase difference from 30 ps to 200 ps.

As shown in FIG. 7, there is provided a first delay line in which four first delay elements (non-inverter buffers) 111-114 delay amount τ1 of which is 50 ps are connected in series, and reference clock CLK is input to the first stage. To the input node of first delay element 111 in the first stage, the second delay line in the first place in which three second delay elements (non-inverter buffers) 121-123 delay amount τ2 of which is 40 ps are connected in series is connected. Similarly, to the connection node of the output node of first delay element 111 in the first stage and the input node of first delay element 112 in the second stage, the second delay line in the second place in which three second delay elements (non-inverter buffers) 131-133 with a delay amount of 40 ps are connected in series is connected. This also applies to the following cases similarly such that, to the connection node of the second stage and the third stage, the third second delay line (the second delay line in the third place) of second delay elements 141-142 is connected, and to the connection node of the third stage and the fourth stage, the fourth second delay line of a second delay element 151 is connected.

Further, to the input node of first delay element 111 in the first stage, the third delay line in which third delay elements (non-inverter buffers) 161-162 a delay amount τ3 of which is 30 ps are connected in series is connected. Similarly, to the output nodes of second delay elements 121, 122, 132, third delay elements (non-inverter buffers) 171, 181, 191 with a delay amount of 30 ps are connected. First to third delay elements 111-114, 121-123, 131-133, 141-142, 151, 161-162, 171, 181, 191 each output a delayed clock that is reference clock CLK delayed by a delay amount described near each delay element.

The other portions are the same as those in the first embodiment, and therefore their explanation is omitted.

There can be various combinations of the delay elements that generate a desired delayed clock.

The embodiments of the present invention are explained as above; however, it is obvious that there can be various modification examples.

The TDC of the present invention can be applied to the field where it is necessary to detect a phase with respect to a reference clock of an operation signal with a high resolution, such as an analog-to-digital (AD) converter and an AD conversion method.

We claim:

1. A time-to-digital converter that detects a phase with respect to a reference clock of a signal to be measured, comprising:

a first delay line in which a plurality of first delay elements that delay an input signal by a first delay amount is connected in series, and to the first delay element in the first stage of which, the reference clock is input;

a second delay line group that is connected to a connection node of the plurality of the first delay elements of the first delay line or an input node of the first delay element in the first stage, and in which at least one or more second delay elements that delay an input signal by a second delay amount different from the first delay amount are connected in series;

a plurality of judgment circuits that judge whether the changing edge of the signal to be measured is advanced or delayed with respect to the changing edge of a signal, which is the delayed reference clock output from the plurality of the first delay elements of the first delay line and the plurality of the second delay elements of the second delay line group; and an operation circuit that calculates a phase with respect to the reference clock of the changing edge of the signal to be measured from the judgment results by the plurality of the judgment circuits, wherein a difference between the first delay amount and the second delay amount is smaller than the first delay amount and the second delay amount.

2. The time-to-digital converter according to claim 1, wherein the difference between the first delay amount and the second delay amount is 1/n of the first delay amount where n is an integer.

3. The time-to-digital converter according to claim 1, wherein the delay amount of the signal, which is the delayed reference clock output from the plurality of the first delay elements does not overlap that output from the plurality of the second delay elements.

4. The time-to-digital converter according to claim 1, further comprising:

a third delay line group that is connected to the connection node of the plurality of the first delay elements of the first delay line or the input node of the first delay element in the first stage, and to the connection node of the plurality of the second delay elements of the second delay line group, and in which at least one or more third delay elements that delay an input signal by a third delay amount different from the first delay amount and the second delay amount are connected in series; and a plurality of additional judgment circuits that judge whether the changing edge of the signal to be measured is advanced or delayed with respect to the changing edge of the signal, which is the delayed reference clock output from the plurality of the third delay elements of the third delay line group, wherein the operation circuit calculates a phase with respect to the reference clock of the changing edge of the signal to be measured from the judgment results of the plurality of the judgment circuits and the plurality of the additional judgment circuits.

* * * * *